(12) United States Patent
Lepro Chavez et al.

(10) Patent No.: US 11,408,074 B2
(45) Date of Patent: Aug. 9, 2022

(54) LIQUID-FREE, POLYMERIC REINFORCEMENT OF NANOSCALE ASSEMBLIES

(71) Applicant: LAWRENCE LIVERMORE NATIONAL SECURITY, LLC, Livermore, CA (US)

(72) Inventors: Xavier N. Lepro Chavez, Dublin, CA (US); Chantel M. Aracne-Ruddle, Livermore, CA (US); Salmaan H. Baxamusa, Livermore, CA (US); Michael Stadermann, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 513 days.

(21) Appl. No.: 15/867,581

(22) Filed: Jan. 10, 2018

(65) Prior Publication Data

US 2019/0211454 A1     Jul. 11, 2019

(51) Int. Cl.
| | |
|---|---|
| *B32B 9/00* | (2006.01) |
| *C23C 16/56* | (2006.01) |
| *B05D 1/00* | (2006.01) |
| *B05D 3/00* | (2006.01) |
| *B05D 3/06* | (2006.01) |
| *B82Y 30/00* | (2011.01) |
| *B29C 70/00* | (2006.01) |

(52) U.S. Cl.
CPC ............... *C23C 16/56* (2013.01); *B05D 1/60* (2013.01); *B05D 1/62* (2013.01); *B05D 3/007* (2013.01); *B05D 3/067* (2013.01); *B29C 70/00* (2013.01); *B82Y 30/00* (2013.01); *B05D 2203/35* (2013.01); *B05D 2256/00* (2013.01)

(58) Field of Classification Search
CPC ............................. Y10T 428/30; B82Y 30/00
USPC ........................................................ 428/408
See application file for complete search history.

(56) References Cited

U.S. PATENT DOCUMENTS

| | | | | |
|---|---|---|---|---|
| 2007/0104860 | A1* | 5/2007 | Gleason | A61K 9/2077 427/2.14 |
| 2014/0160630 | A1* | 6/2014 | Kim | H01G 11/86 361/502 |

OTHER PUBLICATIONS

Jeevendrakumar, V.J.B. et al. (2015) "Wafer Scale Solventless Adhesive Bonding with iCVD Polyglycidylmethacrylate: Effects of Bonding Parameters on Adhesion Energies," Adv. Mater. Interfaces 2:1500076, 1-8.

(Continued)

*Primary Examiner* — Daniel H Miller
(74) *Attorney, Agent, or Firm* — Foley & Lardner LLP

(57) ABSTRACT

Provided herein is a nanoscale material assembly made up of a plurality of nanoscale structures with a crosslinked polymer thermally deposited on the structures. Also disclosed are methods for preparing the nanoscale material assembly with a deposited crosslinked polymer. Further disclosed are various conditions and materials that when used in the preparation of the nanoscale material assemblies further enhance their mechanical properties. In some embodiments, the nanoscale material assemblies can be either nanoscale yarn assemblies or nanoscale sheet assemblies.

7 Claims, 8 Drawing Sheets

(56) References Cited

OTHER PUBLICATIONS

Zhang, M. et al. (2004) "Multifunctional Carbon Nanotube Yarns by Downsizing an Ancient Technology," Science 306(5700):1358-1361.
Zhang, M. et al. (2005) "Strong, Transparent, Multifunctional, Carbon Nanotube Sheets," Science 309(5738):1215-1219.

* cited by examiner

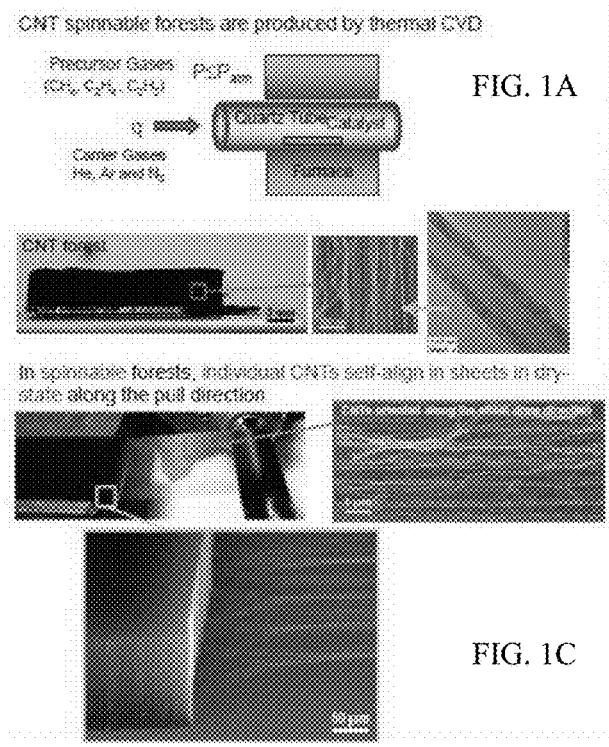
FIG. 1A
FIG. 1C
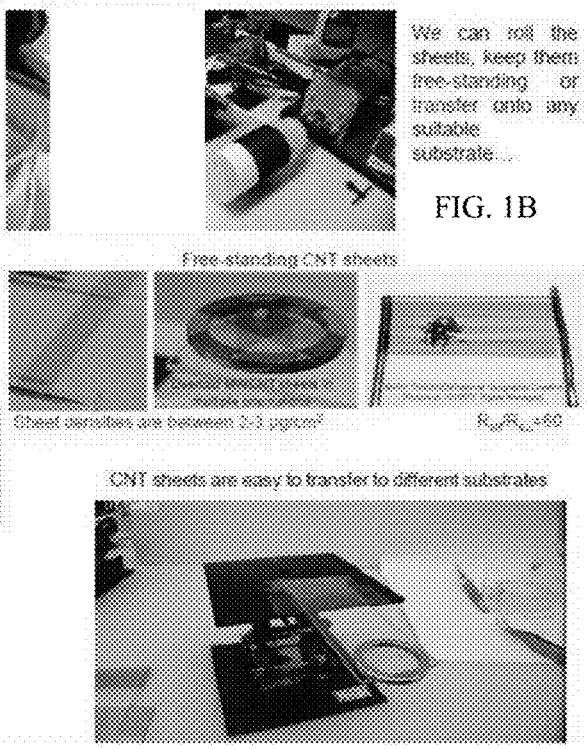
FIG. 1B

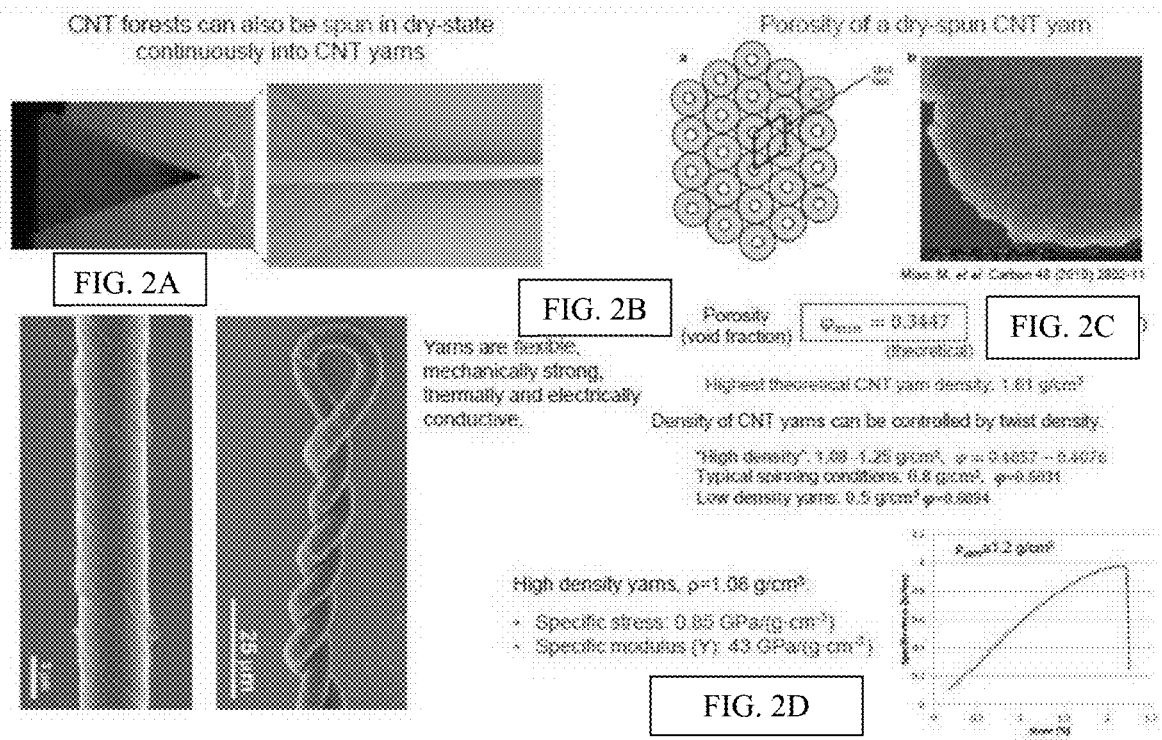

FIG. 8A
FIG. 8B
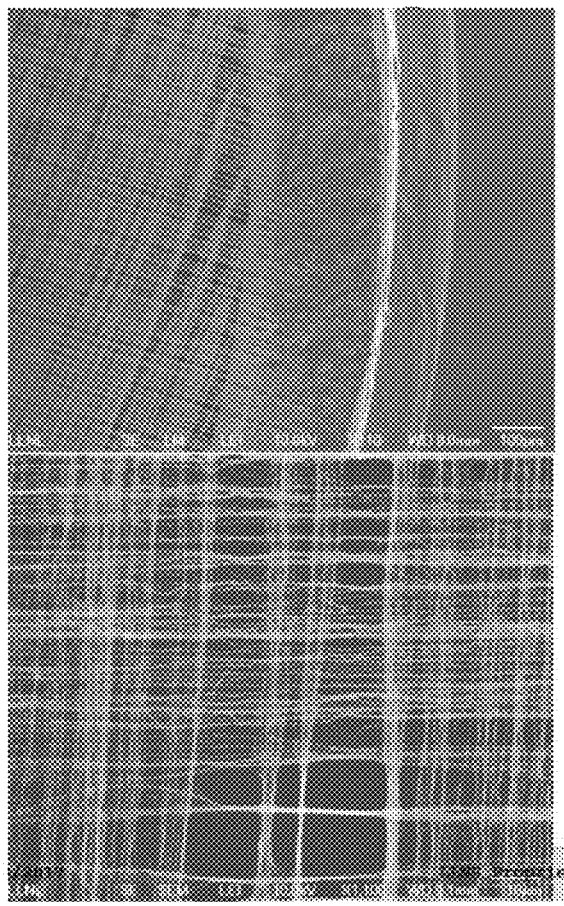
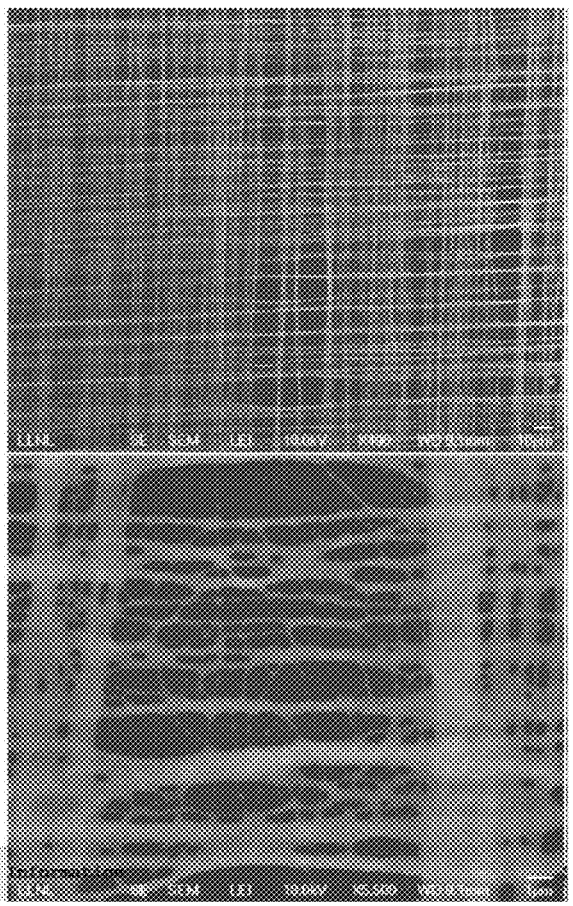
FIG. 8C
FIG. 8D

LIQUID-FREE, POLYMERIC REINFORCEMENT OF NANOSCALE ASSEMBLIES

FEDERAL FUNDING STATEMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

The high strength and conductivity of individual nanoscale materials, like carbon nanotubes (CNTs), makes them attractive options when developing high performance materials. Carbon nanotube aerogels are mechanically strong while still exhibiting air-like volumetric densities. Techniques such as direct CNT sheet drawing and spinning from CNT arrays or forests are possible because their self-assembly properties induce nanotube bundle orientation parallel to a given pull direction. Upon twisting or spinning, drawn sheets can be transformed into flexible, micrometric-thin yarns with a microstructure resembling that of wool or cotton threads used in the textile industry.

Non-covalent interactions such as van der Waals forces and mechanical entanglement are responsible for carbon nanotube self-assembly. However, because these forces are not as strong as covalent bonds, material failure is a problem, especially when subjected to high stress conditions. These failures are often driven by inter-nanotube slippage rather than by the breaking of the covalent carbon-carbon bonds forming individual nanotubes. As a result, carbon nanotube assembled materials while strong, are still weaker than individual nanotubes.

Stronger structures could be obtained then by strengthening the interconnecting linkage points among independent nanotubes through covalent bonding. However, chemical modification of carbon nanotubes is not an easy endeavor, often achieved under harsh conditions involving heat combined with either strong acids or oxidizers or highly energetic plasma-based methods. On the other hand, polymer reinforcement of CNT structures, while successful in increasing the overall strength of spun-yarns does not necessarily promote covalent bonding between the polymer and the nanotubes, which is necessary for achieving an efficient load transference. Moreover, typical assembly preparation involves the use of liquid, solution-based techniques where CNTs arrays or assembled structures are either immersed or dispersed on dissolved or molten polymers. This method leads to the collapse of free-standing nanostructures due to forces exerted by surface tension upon solvent evaporation or matrix densification. To address unwanted collapse, the present technology uses liquid-free polymeric reinforcement of nanoscale assemblies.

SUMMARY

The present technology includes both an apparatus and method to increase mechanical resistance of nanoscale materials through polymer reinforcement by avoiding liquid-based polymerization methods. For example, in one embodiment, applicant uses initiated chemical vapor deposition (iCVD) to allow conformal polymer synthesis directly from the vapor-phase which, by avoiding the use of liquids, retains delicate underlying structures.

Once a polymer has been deposited on the nanoscale assembly it undergoes thermal treatments to induce crosslinking. Once it is crosslinked with the nanoscale assembly, the deposited polymer increases the assemblies' mechanical properties by reinforcing the inter-nanotube entanglement points and reducing nanotube slippage when the material is under tension. This increased mechanical resistance could provide a suitable alternative in a number of material applications, including replacing spider-silk for assembly of tetra-cage capsule supports. No previous iCVD-polymer coated self-assembled nanoscale structures have been reported in the field of yarns and sheet assemblies.

The technology solves the problem of structural collapse of nanotube assemblies and avoids the difficulties associated with using liquids in polymer deposition. These yarn and sheet assemblies are unexpectedly stiffer than originally theorized and could have applications in fields of use such as inertial confinement fusion, electronics, and clothing fabrication, among others, as this list is not exclusive.

Embodiments provided herein include compositions, devices, apparatuses, and articles as well as methods of making and methods of using the compositions, devices, and articles.

For example, one embodiment provides a unique method for fabricating a nanoscale material assembly, comprising depositing a thermally self-crosslinkable polymer on a nanoscale material substrate comprising a plurality of nanoscale structures; and inducing crosslinking of the thermally self-crosslinkable polymer deposited on the nanoscale structures by thermalizing the thermally self-crosslinkable polymer to obtain a nanoscale material assembly comprising a crosslinked polymer.

In one embodiment of the method the nanoscale material substrate comprises a carbon nanotube sheet assembly comprising a plurality of carbon nanotubes or a carbon nanotube yarn assembly comprising a plurality of carbon nanotubes.

In one embodiment of the method the deposition comprises placing the nanoscale material substrate into a vacuum chamber; and depositing a precursor and a reaction initiator of the thermally self-crosslinkable polymer to the nanoscale material substrate comprising the plurality of nanoscale structures under polymerization condition, wherein the thermally self-crosslinkable polymer is produced in situ from the precursor and the reaction initiator.

In one embodiment of the method the inducing comprises thermalizing the thermally self-crosslinkable polymer deposited on the nanoscale structures within an environment comprising a gaseous bleed.

In one embodiment of the method the nanoscale material assembly comprises a metal mesh or another material capable of undergoing initiated chemical vapor deposition.

In one embodiment of the method the crosslinking takes place under ultraviolet light or in a gas-phase chemical reactor chamber.

In one embodiment of the method the thermally self-crosslinkable polymer is poly-glycidyl methacrylate (PGMA).

In one embodiment of the method the thermally self-crosslinkable polymer is any one or a combination of acrylates or methacrylate based polymers capable of being coated onto a nanoscale structure via initiated chemical vapor deposition.

In one embodiment of the method the deposition conditions are between 100° to 350° C. for the filament, 13° and 40° Celsius for the assembly and between 0.001 torr and 100 torr for the reactor.

In one embodiment of the method the thermalizing takes place for anywhere from 15 minutes to 120 minutes and in a temperature range from 80° Celsius to 200° Celsius.

In one embodiment of the method, prior to deposition, a solvent is used to condense the yarn assemblies or sheet assemblies.

In one embodiment of the method the precursor comprises glycidyl methacrylate and the reaction initiator comprises tert-butylperoxide (TBPO).

In one embodiment of the method the gaseous bleed is an inert gas.

In one embodiment of the method the solvent is alcohol or acetone.

In at least one embodiment the method does not comprise depositing the thermally self-crosslinkable polymer or inducing crosslinking of the thermally self-crosslinkable polymer in a liquid phase. In at least one embodiment the method does not comprise depositing the thermally self-crosslinkable polymer or inducing crosslinking of the thermally self-crosslinkable polymer on a flat substrate or as a bonding adhesive between two flat substrates.

Another embodiment comprises a nanoscale material assembly comprising a plurality of nanoscale structures with at least one crosslinked polymer deposited on the nanoscale structures, wherein said crosslinked polymer is obtained by crosslinking a thermally self-crosslinkable polymer after deposition thereof on the nanoscale structures.

In one embodiment the nanoscale material assembly comprises a carbon nanotube sheet assembly comprising a plurality of carbon nanotubes or a carbon nanotube yarn assembly comprising a plurality of carbon nanotubes.

In one embodiment of the nanoscale material assembly the thermally self-crosslinkable polymer is deposited by in situ production thereof on the structures through initiated chemical vapor deposition.

In one embodiment of the nanoscale material assembly the thermalizing source for crosslinking the thermally self-crosslinkable polymer is a furnace or ultraviolet light.

In one embodiment of the nanoscale material assembly the assembly comprises a metal mesh or another material that can be placed into a reactor and is stable at initiated chemical vapor deposition conditions used to deposit the polymer.

In one embodiment of the nanoscale material assembly the thermally self-crosslinkable polymer is poly-glycidyl methacrylate.

In one embodiment of the nanoscale material assembly the thermally self-crosslinkable polymer is any one or a combination of acrylates or methacrylate based polymers capable of being coated onto a nanoscale structure via initiated chemical vapor deposition.

In one embodiment of the nanoscale material assembly the deposition conditions are between 100° to 350° C. for the filament, 10° and 40° Celsius for the assembly and between 0.001 torr and 100 torr for the reactor.

These and other features, together with the organization and manner of operation thereof, will become apparent from the following detailed description when taken in conjunction with the accompanying drawings.

BRIEF DESCRIPTION OF THE DRAWINGS

FIGS. 1A-1C: Free-standing sheets of aligned CNTs. FIG. 1A. Depiction of the synthesis of a CNT spinnable forest by thermal CVD treatment, by flowing a set of precursors and carrier gases on a catalyst substrate that was placed inside a heated quartz tube chamber. FIG. 1B. Depiction of the continuous rolling of a free-standing CNT sheet and its placement on different substrates. FIG. 1C. Optical picture of a 5 cm wide CNT forest, and electronic microscopy pictures of CNTs oriented along the sheet draw direction (scale bars are 1 μm and 50 μm).

FIGS. 2A-2D: Twisting Carbon Nanotube Sheets Into Yarns. FIG. 2A. CNT Forests are continuously dry-spun into CNT yarns and 2 μm and 25 μm scaled photographs of nanoscale yarns. FIG. 2B. Unit Cell Depiction and Drawing of the Porosity of a Spun-Yarn Assembly. FIG. 2C. Photograph of the cross-section of a spun yarn assembly. FIG. 2D. Stress-strain curve of a high-density yarn.

FIG. 6 again shows a PGMA coated yarn assembly versus an uncoated yarn assembly, but this Figure depicts a cyclic elastic test. Cyclic stress testing uses the distribution of forces or stresses that change over time in a repetitive fashion. Here, the stress is measured in Pascals (y-axis) and the denominator of strain or elongation ($l/l_0-1$) is multiplied by a factor of 100 and presented as percentage. PGMA coated, 40 k/m twist density yarn assemblies are shown compared against uncoated yarn assemblies.

FIGS. 8A-8D: Cross-linking PGMA Coated CNT Sheets: The images in FIGS. 8A-8D show PGMA coated CNT sheets at different scales. FIG. 8A is on the 100 μm scale, FIG. 8B is on the 10 μm scale, FIG. 8C is a different multiplied lens factor (X1,100) but still on the 10 μm scale, and FIG. 8D is on the 1 μm scale.

DETAILED DESCRIPTION

Figure 3:
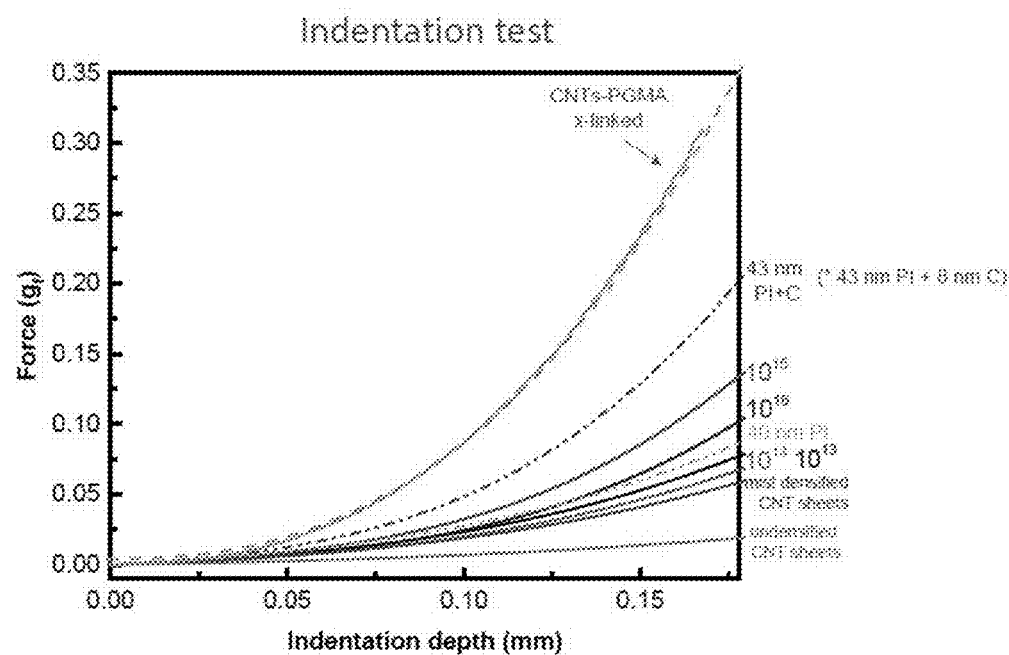
FIG. 3: Indentation Test. Plot of the results of an Indentation Test. Y-axis depicts Force ($g_f$) and x-axis is Indentation depth (mm). CNTs with poly(glycidyl methacrylate) (PGMA) cross-linked coating are compared to the indentation depths of polyimide continuous free-standing films and ion irradiated assemblies. Coated sheets are also compared to mist densified and undensified CNT sheets.

Reference will now be made in detail to some specific embodiments of the invention contemplated by the inventors for carrying out the invention. Certain examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

A. DEFINITIONS

Before the present compositions, and methods are described, it is to be understood that the invention is not limited to the particular methodologies, protocols, and apparatuses described, as these may vary. It is also to be understood that the terminology used herein is intended to describe particular embodiments of the present invention, and is in no way intended to limit the scope of the present invention as set forth in the appended claims.

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Throughout and within this disclosure, patent ad technical literature are referenced by an identifying citation or an Arabic number within parentheses, the full citations of which are found in the section immediately preceding the claims. All technical and patent publications cited herein are incorporated herein by reference in their entirety. Nothing herein is to be construed as an admission that the invention is not entitled to antedate such disclosure by virtue of prior invention.

In accordance with the present invention and as used herein, the following terms are defined with the following meanings, unless explicitly stated otherwise.

As used in the specification and claims, the singular form "a", "an" and "the" include plural references unless the context clearly dictates otherwise.

All numerical designations, e.g., temperature, torr, Pascals, time, concentration, and molecular weight, including ranges, are approximations which are varied (+) or (−) by increments of 0.1 or 1.0, where appropriate. It is to be understood, although not always explicitly stated that all numerical designations are preceded by the term "about". It also is to be understood, although not always explicitly stated, that the solvents described herein are merely exemplary and that equivalents of such are known in the art.

As used herein, the term assembly encompasses composite materials made up of nanoscale structures including, but not limited to, nanoscale yarns and nanoscale sheets.

As used herein, bleed encompasses a fluid or gas that enters a closed system, most commonly through a valve.

As used herein, carbon nanotube sheets encompass free-standing sheets of preferentially aligned CNTs manufactured by pulling from the edge of CNT arrays (or forests) produced by chemical vapor deposition.

As used herein, crosslinking encompasses the action that occurs when a preselected polymer is put under certain thermal conditions that cause it to fortify its covalent bond interactions.

As used herein, deposit encompasses a particle or molecule settled out of a solution onto a substrate or surface.

As used herein, deposition encompasses the act of when a particle or molecule settles out of a solution. It is the reverse process of dissolution.

As used herein, inert gas encompasses a gas that does not undergo chemical reactions under a set of given conditions. Examples of inert gases include, but are not limited to, nitrogen, helium, neon, argon, krypton, xenon, and radon.

As used herein, initiated chemical vapor deposition encompasses any of Hot filament CVD (HFCVD) or catalytic CVD (Cat-CVD) or initiated CVD (iCVD). This process often uses, though is not limited to, a hot filament to chemically decompose the source gases. The filament temperature and substrate temperature thus are independently controlled, allowing colder temperatures for better adsorption rates at the substrate and higher temperatures necessary for decomposition of precursors to free radicals at the filament.

As used herein, metal mesh encompasses any nanostructure made up of metal constituents that can be placed in a vacuum chamber or iCVD reactor or subject to any other type of deposition wherein a chemical is deposited on a polymer substrate.

As used herein, nanoscale material assembly encompasses any assemblage of nanoscale materials grouped in a cohesive manner, at the very least including nanoscale yarn assemblies and nanoscale sheet assemblies.

As used herein, nanotube encompasses a tubular molecule composed of a large number of carbon atoms.

As used herein, precursor encompasses a compound or a monomer that participates in a chemical reaction that produces another compound or a polymer, herein including at least glycidyl methacrylate.

As used herein, reaction initiator encompasses a source of any chemical species that reacts with a monomer or monomers to form an intermediate compound capable of linking successively with a larger number of other monomers into a polymeric compound.

As used herein, sheet encompasses a collection of nanostructures that create free-standing sheets of preferentially aligned nanostructures when pulled from the edge of nanostructure arrays (or forests). A sheet in some embodiments can be used as a substrate.

As used herein, sheet assembly encompasses a plurality of individual carbon nanotube sheets that are prepared, at least in part, by placing individual carbon nanotube sheets on top of each other in orthogonal direction or at any other rotated angle on an open support.

As used herein, stiffness encompasses a measure of the resistance offered by an elastic body to deformation. In mathematical definition terms it is defined as the force on a body divided by the displacement produced by the force along the same degree of freedom (e.g., the change in length of a stretched spring).

As used herein, a substrate encompasses a substance or layer that underlies something, or on which some process occurs.

As used herein, thermalize encompasses the exposure of a structure, assembly, sheet, array or any other material to a source of heat, UV, other type of light, or any other means for inducing crosslinking of a chose polymer.

As used herein, thermally self-crosslinkable polymer encompasses any polymer that when brought under the application of heat or light or any other thermal source creates covalent cross-linking of polymeric assemblies.

As used herein, vacuum chamber encompasses, but is not limited to, an initiated Chemical Vapor Deposition (iCVD) reactor.

As used herein, yarn assembly encompasses a plurality of individual carbon nanotube sheets that are prepared, at least in part, by either inserting twist into pulled nanostructure sheets or by direct spinning (twisting while pulling) from nanostructure forests or arrays.

B. MODES FOR CARRYING OUT THE DISCLOSURE

Methods to Prepare Nanoscale Material Assemblies

Applicants have developed an apparatus and a method for polymer reinforcement of nanoscale material assemblies, such as carbon nanotube yarns and aerogel sheets, by depositing a self-crosslinking polymer on the nanoscale material assembly and then thermalizing the polymer, without inducing structural collapse. Nanoscale material assemblies, such as carbon nanotube sheets and yarns, retain their shape after the process and can be handled without the need of additional provisions to the ones already used for untreated materials. In one embodiment of the claimed methods, Young's modulus of polymer-reinforced nanoscale assemblies increases according to the amount of polymer deposited on the assemblies. Applicants demonstrate that coating nanoscale material assemblies with a minimal amount of thermally self-crosslinking polymer increases the Young's modulus of the nanoscale material assembly. For example in one embodiment, coating a carbon nanotube sheet or carbon nanotube yarn with a thin film of PGMA increases its Young's Modulus to values greater or equal to 20 Gpa. In this embodiment, the amount of PGMA deposited is equivalent to a thin film of less than 200 nanometers on a flat substrate.

Methods to Prepare Carbon Nanotube Sheet Assemblies

In one embodiment, thermally self-crosslinking polymers are deposited on carbon nanotube sheet assemblies. In this process free-standing sheets of preferentially aligned carbon nanotubes are manufactured by pulling from the edge of carbon nanotube arrays (or forests) produced by chemical vapor deposition as described in Zhang, M., K. R. Atkinson, and R. H. Baughman, *Multifunctional Carbon Nanotube Yarns by Downsizing an Ancient Technology*, SCIENCE, 2004. 306(5700): 1358-1361, and also in Zhang, M. et al., *Strong, Transparent, Multifunctional Carbon Nanotube Sheets*, SCIENCE, 2005. 309(5738): 1215-1219, each of which is incorporated herein by reference in its entirety. Sheet assemblies are then prepared by placing individual carbon nanotube sheets on top of each other in orthogonal direction or at any other rotated angle on an open support. In one embodiment, internanotube distance can then be minimized by the exposing carbon nanotube sheets to a mist or aerosol of a solvent or mix of solvents (e.g. alcohol, acetone, etc.) which densities the structure among carbon nanotube bundles and increases individual nanotube contacting area. Following preparation a layer of thermally self-crosslinking polymer is deposited on the carbon nanotube sheet assemblies. In one embodiment of this step, the carbon nanotube sheet assemblies are placed into a filament-heated low-vacuum chamber (iCVD reactor) and exposed to polymerization conditions for the thermally self-crosslinking polymer using a precursor and a reaction initiator. In one embodiment, the thermally self-crosslinking polymer is PGMA. In one embodiment the polymerization conditions are $100° C.<T_{filament}<300° C., 13° C.<T_{sheet\ assembly}<40° C.$ and $0.001\ torr<P<100\ torr$). In one embodiment, glycidyl methacrylate is used as a precursor and tert-butylperoxide (TBPO) is used as the reaction initiator.

After the polymer has been deposited on the nanoscale sheet assembly it is thermalized to induce self-crosslinking. In one embodiment, PGMA coated-CNT samples are inserted into a vacuum furnace under a $N_2$ bleed and thermalized by 15-120 min to temperatures ranging between 80-200° C. to induce the self-crosslinking of PGMA.

Upon completion of the process, the obtained sheet assemblies are chemically and mechanically stable under room conditions of humidity and light.

Methods to Prepare Carbon Nanotube Yarn Assemblies

In one embodiment, thermally self-crosslinking polymers are deposited on carbon nanotube yarn assemblies. In this process free-standing sheets of preferentially aligned carbon nanotubes are manufactured by pulling from the edge of carbon nanotube arrays (or forests) produced by chemical vapor deposition as described in both Zhang, et al. references [1, 2]. Yarn assemblies are then produced by either inserting twist into pulled carbon nanotube sheets or by direct spinning (twisting while pulling) from forests. In one embodiment, inter-nanotube distance can be reduced by wet-densifying the carbon nanotube yarn with suitable solvents (e.g. alcohol, acetone, etc.). Following densification, a layer of thermally self-crosslinking polymer is deposited on the carbon nanotube yarn assemblies. In one embodiment of this step, the carbon nanotube yarn assemblies are placed into a filament-heated low-vacuum chamber (iCVD reactor) and exposed to polymerization conditions for the thermally self-crosslinking polymer using a precursor and a reaction initiator. In one embodiment, the thermally self-crosslinking polymer is PGMA. In one embodiment the polymerization conditions are $100° C.<T_{filament}<300° C., 13° C.<T_{sheet\ assembly}<40° C.$ and $0.001\ torr<P<100\ torr$). In one embodiment, glycidyl methacrylate is used as a precursor and tert-butylperoxide (TBPO) is used as the reaction initiator.

After the polymer has been deposited on the nanoscale sheet assembly it is thermalized to induce self-crosslinking. In one embodiment, PGMA coated-CNT samples are inserted into a vacuum furnace under a $N_2$ bleed and thermalized by 15-120 min to temperatures ranging between 80-200° C. to induce the self-crosslinking of PGMA.

Upon completion of the process, the obtained thermally self-crosslinked coated yarn assemblies are chemically and mechanically stable under room conditions of humidity and light.

C. MATERIALS AND METHODS

Materials:

Below we describe some of the preferred materials and methods used in producing liquid-free polymeric reinforced nanoscale material assemblies.

Free-standing sheets of aligned carbon nanotubes are one preferred embodiment of nanoscale sheet assemblies. Carbon nanotube spinnable forests, another preferred embodiment, can be produced by thermal chemical vapor deposition (FIG. 1). In spinnable forests, individual carbon nanotubes self-align in sheets in dry-state along their pull direction. Applicants can roll the sheets, keep them free-standing or transfer them onto any suitable substrates (FIG. 1).

Yarn assemblies, another preferred embodiment, are flexible, mechanically strong, and thermally and electrically conductive. They exhibit porosity (FIG. 2). Also, yarn assemblies can be given different twist densities (i.e., twists per length of yarn). Twist density is measured in turns per meter of yarn or kiloturns (i.e. 1,000 turns=1 k) per meter of yarn, kturns/m or k/m as short notation. Yarns also have varied density in varied embodiments. High density yarns may exhibit 1.08-1.25 g/cm$^3$ (void fraction, $\varphi$=0.4857-0.4076), typical spinning condition is 0.8 g/cm$^3$ ($\varphi$=0.5031) and low density is 0.5 g/cm$^3$ ($\varphi$=0.6894). In one embodiment, the highest theoretical yarn density is 1.61 g/cm$^3$ (FIG. 2). The high density yarns, with $\rho$=1.08 g/cm$^3$, in some embodiments show specific stress of 0.85 Gpa/(g cm$^{-3}$) and a specific modulus of 43 GPa/(g cm$^{-3}$).

In some embodiments, the yarn assemblies and the sheet assemblies undergo treatment to reduce inter-nanotube distance between the individual nanotubes. In these embodiments, the yarn assemblies inter-nanotube distance is reduced by wet-densifying the final CNT yarn with suitable solvents, such as alcohol, acetone, or other solvents capable of reducing inter-nanotube distance. In other embodiments, sheet assembly inter-nanotube distance is reduced by exposing the CNT sheets to a mist or aerosol of a solvent or mix of solvents, for example alcohol, acetone, or other solvents capable of reducing inter-nanotube distance.

In some embodiments, the nanoscale assemblies are placed in filament heated low vacuum chambers or iCVD reactors (e.g., iLab coating system, GVD) and exposed to various polymerization conditions. In some embodiments, but not all, conditions range between 100-300° C. for the filament. For a substrate or sheet assembly, a preferred embodiment uses the temperature ranges of 10°-40° C. and a preferred pressure of 0.001 torr to 100 torr.

After deposition, the assemblies are subject to thermal treatment to induce self-crosslinking of the deposited polymer. In some embodiments the treated nanoscale assemblies are placed in vacuum furnaces. In some embodiments, the furnace is a box or quartz tube furnace. If placed in a vacuum furnace for thermalization, gaseous bleeds may be used. One preferred gaseous bleed is $N_2$, however, other inert gases are capable of producing desired results, and even some non-inert gas environments may capable be as well. Thermalizing may take place over a range of times and temperatures. One preferred time range is 15-120 minutes. One preferred temperature range is 80-200° C.

Methods:

The nanoscale assemblies underwent tensile and indentation testing to measure their stiffness and mechanical resistance.

Figure 4:
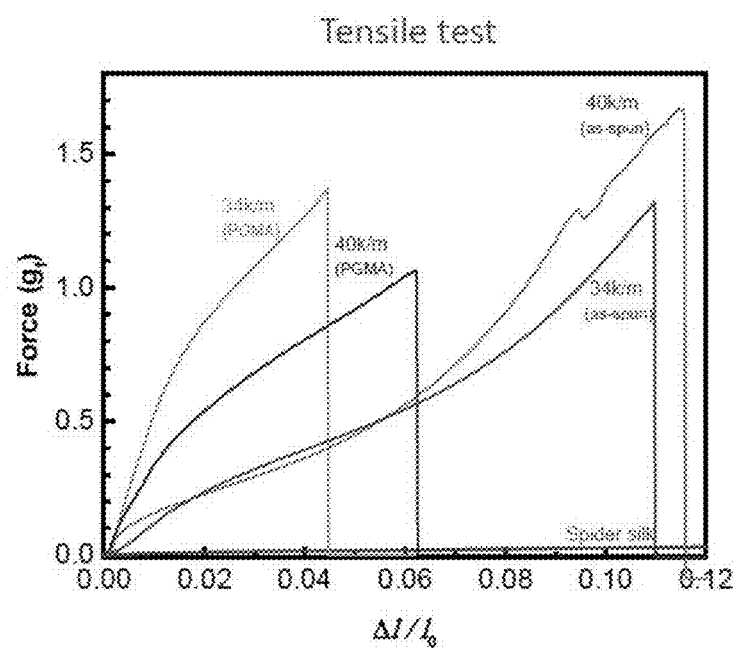
FIG. 4: Tensile Test 1: Yarns of different twist density (34 kturns/m and 40 kturns/m) and deposition (PGMA coated and as-spun without coating) are compared for their stress-strain properties: a 34 k/m twist density, PGMA coated curve, a 40 k/m twist density, PGMA coated curve, a 34 k/m twist density, as-spun curve, a 40 k/m twist density, as-spun curve, and spider silk.

Indentation testing is one method of performing analysis on the nanoscale material assemblies' hardness, stiffness, strength and pliability (FIG. 3 and FIG. 4). Test results are usually shown on a two dimensional plot with the y-axis representing the asserted force ($g_f$) and the x-axis indicating the depth (mm) a test ball has traveled into the material.

Figure 5:
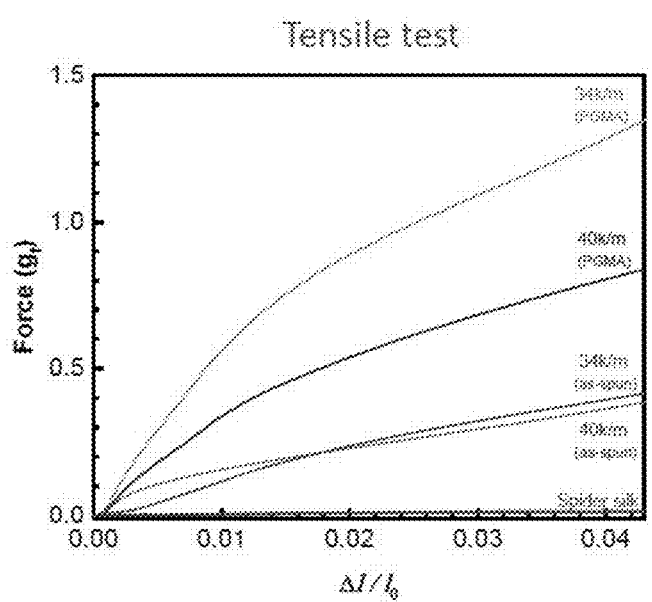
FIG. 5: Tensile Test 2: Yarns of different twist density (34 k/m and 40 k/m) and deposition (PGMA coated and as-spun without coating) are compared for their stress-strain properties: a 34 k/m twist density, PGMA coated curve, a 40 k/m twist density, PGMA coated curve, a 34 k/m twist density, as-spun curve, a 40 k/m twist density, as-spun curve, and spider silk.
Figure 6:
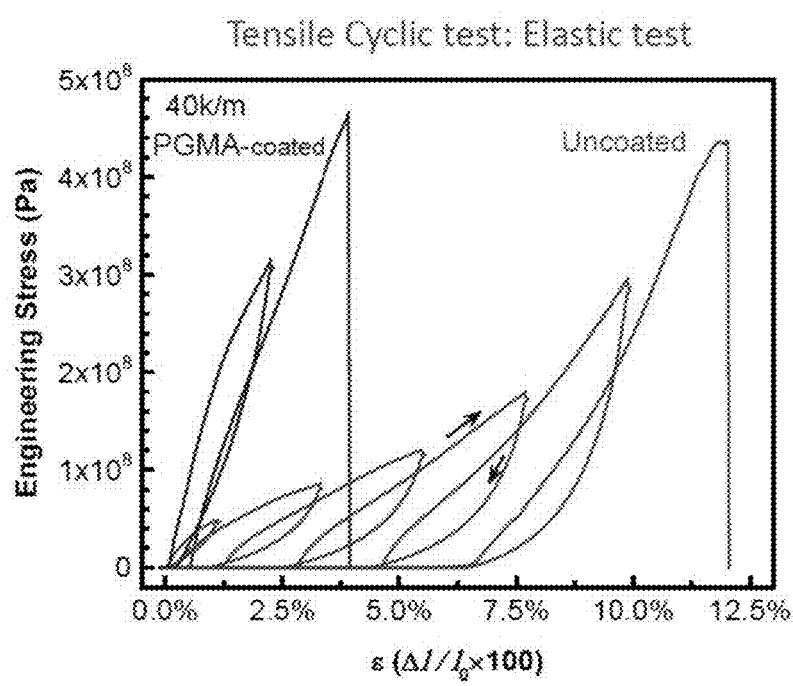
FIG. 6: Tensile Test 3: Tensile Cyclic Test.

Tensile tests (FIG. 4, FIG. 5 and FIG. 6) are used to indicate how the nanoscale material assemblies perform when a force is applied. The displacement or elongation (x-axis) is measured per unit force (y-axis) and the slope of the plot is the Modulus of Elasticity or the Young's Modulus, which is an indicator of a material's stiffness. FIG. 6 plots a cyclic stress test. Cyclic stress testing uses the distribution of forces or stresses that change over time in a repetitive fashion.

D. EXPERIMENTAL RESULTS AND DISCUSSION

Applicants have shown that the Young's Modulus of a nanoscale material assembly increases depending on the amount of thermally self-crosslinking polymer added to the yarns and sheets. For example, a thin film of PGMA on the yarns (equivalent to less than 200 nanometers on a flat substrate) can increase the Young's Modulus by up to 20 Gpa. Several figures further illustrate this point.

In FIG. 3, we are shown a plot of the results of an Indentation Test. The y-axis depicts Force ($g_f$) and the x-axis is Indentation depth (mm). CNTs with PGMA cross-linked coating are compared to the indentation depths of polyimide continuous free-standing films and ion irradiated assemblies. In FIG. 3, Coated sheets are also compared to mist densified and undensified CNT sheets. As mentioned in [0058] above, Indentation Tests are used in mechanical engineering to test the hardness of a material to deformation. (FIG. 2) Hardness measurements quantify the resistance of a material to plastic deformation. For indentation test setup, applicant put the ball head on top of the membrane created by the CNT and determined how far the ball traveled before failure of the membrane. In other words, inserting a mechanical stress on a localized region of the membrane to measure the force the membrane is experiencing thereby showing the strength of the treated material. In FIG. 3, we can see that CNTs with a PGMA crosslinked deposition exhibit the highest force exertion before mechanical failure. Higher than the polyimide continuous free standing films, all four ion irradiated CNT sheet assemblies and both the mist densified and undensified CNT sheets.

A tensile test, also known as a tension test, allows a manufacturer to pull or exert stress on a material until its point of failure, or "ultimate strength," and test its stiffness, among other properties. The slope of the linear part of the curve anywhere below the Elastic Limit is equivalent to Young's Modulus of Elasticity. The linear portion of the curve obeys the relationship defined as Hooke's Law where the ratio of stress is a constant, or E. E is the slope of the line in this region where stress or force (here, $g_f$) is proportional to strain or elongation (here, $\Delta l/l_0$). In FIG. 4 and FIG. 5, yarns of different twist density (34 k/m and 40 k/m) and deposition (PGMA coated and as-spun without coating) are compared for their stress-strain properties: a) a 34 k/m twist density, PGMA coated curve, b) the 40 k/m twist density, PGMA coated curve, c) the 34 k/m as-spun curve, d) the 40 k/m twist density, as-spun curve, and e) spider silk.

It is apparent that the two curves with PGMA coating have a steeper Young's Modulus of Elasticity than those without the PGMA coating. This indicates that they have greater mechanical stiffness than the 40 k/m, as-spun, 34 k/m as-spun, and spider silk curves. The 34 k/m, PGMA coated curve has the highest Young's Modulus, indicating that it is the stiffest of the five tested materials in both FIG. 4 and FIG. 5.

FIG. 6 again shows a PGMA coated yarn assembly versus an uncoated yarn assembly, but this figure depicts a cyclic elastic test. Here, the stress is measured in Pascal (y-axis) and the denominator of strain or elongation ($l/l_0-1$) is multiplied by a factor of 100. PGMA coated, 40 k/m twist density yarn assemblies are shown compared to uncoated yarn assemblies. Cyclic stress testing uses the distribution of forces or stresses that change over time in a repetitive fashion and test for material creep.

Figure 7:
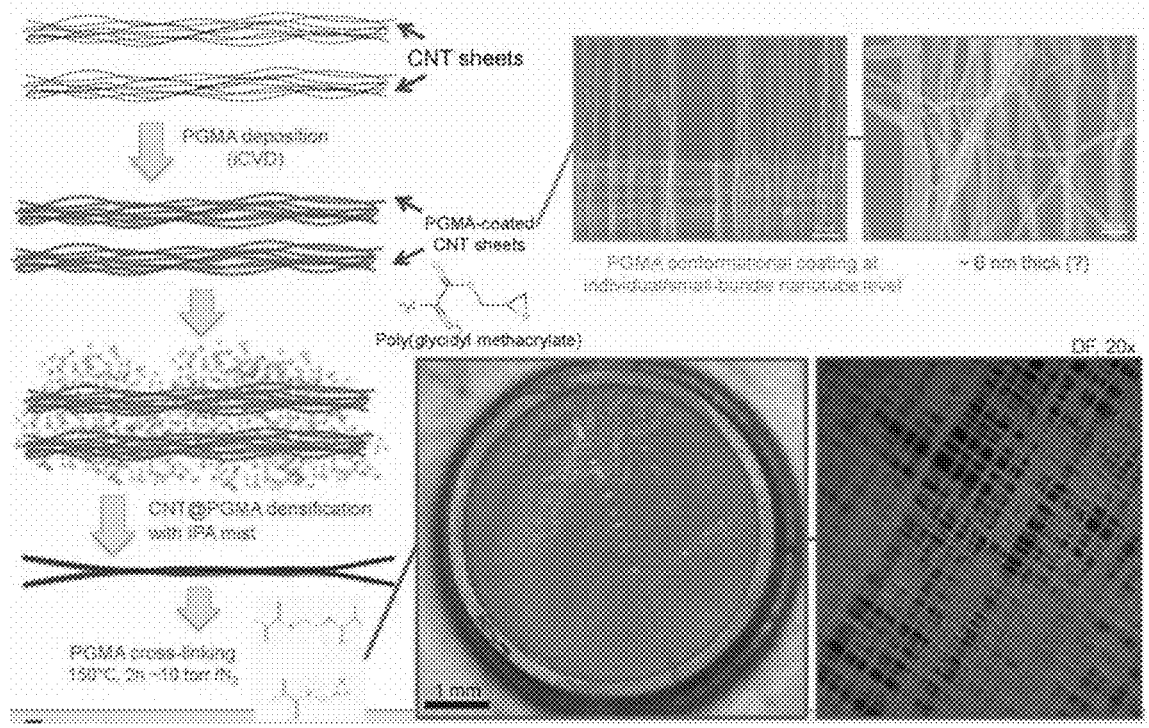
FIG. 7: Cross-Linking PGMA-Coated CNT Sheets: The pictures on the left side of FIG. 7 are depictions of the stages of CNT sheets assemblies. In sequence, they are: 1) before going through thermally self-crosslinkable polymer deposition, 2) after thermally self-crosslinkable polymer has been deposited, 3) after the CNT sheets have been densified with an IPA mist and 4) a depiction of the PGMA cross-linking under suitable thermal conditions, here for example, 150° C., 2 h~10 torr/$N_2$. The images on the top right show the PGMA conformational coating at an individual or small bundle nanotube level. The 6 nanometer thickness indicates the thickness of the PGMA coating, not the dimensions of the CNT diameter. The images on the bottom right show 1 mm and DF, 20× scale optical images of the CNT sheet assemblies.

FIG. 7 depicts some of the stages of CNT sheets assemblies; in sequence they are: 1) before going through thermally self-crosslinkable polymer deposition, 2) after a thermally self-crosslinkable polymer has been deposited, 3) after CNT sheets have been densified with an IPA mist and 4) a depiction of the PGMA cross-linking under suitable thermal conditions, here for example, 150° C., 2 h~10 torr/$N_2$. The images on the top right show the PGMA conformational coating at an individual or small bundle nanotube level. The images on the bottom right show 1 mm and DF, 20× scale images of the CNT sheet assemblies. When not treated with polymer coating, the carbon nanotube sheet assemblies would appear black, but the coloration changes to white when treated in these images.

The images in FIGS. 8A-8D show PGMA coated CNT sheets at different scales. FIG. 8A is on the 100 μm scale, FIG. 8B is on the 10 μm scale, FIG. 8C is a different multiplied lens factor (X1,100) but still on the 10 μm scale, and FIG. 8D is on the 1 μm scale. After conglomeration of the polymer, the nanostructure array changes. The 1 μm image shows a magnified view of the linking of the thermally self-crosslinkable polymers.

E. APPLICATIONS

The technology of this application finds application in many realms of material science and fabrication, and the list disclosed herein is not meant to be nearly exhaustive.

Inertial Confinement Fusion

These strong and lightweight thermally self-crosslinked nanoscale assemblies may be used as capsule support materials required in the inertial confinement fusion (ICF) experiments. Current thin-polymeric film membranes holding ablators inside a hohlraum in ICF experiments have a detrimental effect in the symmetry of implosions. Lack of symmetry decreases the energetic efficiency of each shot in inertial confinement fusion experiments. Alternative materials of similar density and mechanical strength than polymer membranes that have a lower contacting surface with the ablator, as CNT yarns and sheets, are expected to have a minimized effect on the shockwave propagation during ICF implosion experiments.

The nanoscale assemblies described herein may also act as alternatives to spider silk for assembly of tetra-cage capsule supports given that the reinforced yarns/sheets have similar densities to spider silk (0.6-1.0 g/$cm^3$) and diameters. Due to the conductivity of the nanoscale assemblies in the current disclosure, it may also have application in clothing and textiles. The yarn assemblies may be useful when incorporated into clothing and provide electrical components and circuitry for such use.

The porous carbon yarns and sheets disclosed herein with high tensile stiffness and strength may further find use as a new class of polymer composites, support for separation membranes and other mechanical and electrical conductive components.

As used herein, the singular terms "a," "an," and "the" include plural referents unless the context clearly dictates otherwise. Thus, for example, reference to a compound can include multiple compounds unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

In the foregoing description, it will be readily apparent to one skilled in the art that varying substitutions and modifications may be made to the invention disclosed herein without departing from the scope and spirit of the invention. The invention illustratively described herein suitably may be practiced in the absence of any element or elements, limitation or limitations, which is not specifically disclosed herein. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention. Thus, it should be understood that although the present invention has been illustrated by specific embodiments and optional features, modification and/or variation of the concepts herein disclosed may be resorted to by those skilled in the art, and that such modifications and variations are considered to be within the scopes of this invention.

The invention claimed is:

1. A nanoscale material assembly comprising:
   at least one nanoscale substrate comprising a plurality of carbon nanotubes having a plurality of inter-nanotube entanglement points, the plurality of carbon nanotubes arranged as yarns or free-standing sheets with at least one crosslinked polymer deposited on the nanoscale substrate, wherein said crosslinked polymer is obtained by crosslinking a thermally self-crosslinkable polymer comprising poly-glycidyl methacrylate (PGMA) after vapor-phase deposition thereof on the nanoscale substrate at a temperature greater than 100 degrees Celsius, the PGMA having an amount equivalent to a thin film of less than 200 nm on a flat substrate and forming at least a threshold amount of mechanical reinforcing of the plurality of inter-nanotube entanglement points such that the at least one nanoscale substrate has a Young's modulus of elasticity of at least 20 GPa.

2. The nanoscale material assembly of claim 1, wherein the thermally self-crosslinkable polymer is deposited by in situ production thereof on the structures through initiated chemical vapor deposition.

3. The nanoscale material assembly of claim 1, wherein a thermalizing source for crosslinking the thermally self-crosslinkable polymer is a furnace or ultraviolet light.

4. The nanoscale material assembly of claim 1, wherein the assembly comprises a metal mesh or another material that can be placed into a reactor and is stable at initiated chemical vapor deposition conditions used to deposit the polymer.

5. The nanoscale material assembly of claim 1, wherein the thermally self-crosslinkable polymer is poly-glycidyl methacrylate.

6. The nanoscale material assembly of claim 1, wherein the thermally self-crosslinkable polymer is any one or a combination of acrylates or methacrylate based polymers capable of being coated onto a nanoscale structure via initiated chemical vapor deposition.

7. The nanoscale material assembly of claim 1, wherein the deposition conditions are between 100° to 350° C. for the filament, 10° and 40° Celsius for the assembly and between 0.001 torr and 100 torr for the reactor.

* * * * *